United States Patent
Gaska et al.

(10) Patent No.: US 9,514,947 B2
(45) Date of Patent: Dec. 6, 2016

(54) CHROMIUM/TITANIUM/ALUMINUM-BASED SEMICONDUCTOR DEVICE CONTACT FABRICATION

(71) Applicant: Sensor Electronic Technology, Inc., Columbia, SC (US)

(72) Inventors: Remigijus Gaska, Columbia, SC (US); Xuhong Hu, Columbia, SC (US); Michael Shur, Latham, NY (US); Mikhail Gaevski, West Columbia, SC (US)

(73) Assignee: Sensor Electronic Technology, Inc., Columbia, SC (US)

( * ) Notice: Subject to any disclaimer, the term of this patent is extended or adjusted under 35 U.S.C. 154(b) by 0 days.

(21) Appl. No.: 14/747,150

(22) Filed: Jun. 23, 2015

(65) Prior Publication Data

US 2015/0287602 A1 Oct. 8, 2015

Related U.S. Application Data

(63) Continuation-in-part of application No. 14/316,907, filed on Jun. 27, 2014, now Pat. No. 9,064,845, which
(Continued)

(51) Int. Cl.
*H01L 29/43* (2006.01)
*H01L 29/45* (2006.01)
(Continued)

(52) U.S. Cl.
CPC ........... *H01L 21/283* (2013.01); *H01L 23/482* (2013.01); *H01L 24/03* (2013.01); *H01L 24/05* (2013.01);
(Continued)

(58) Field of Classification Search
CPC ........ H01L 29/43; H01L 29/45; H01L 29/452; H01L 29/456
See application file for complete search history.

(56) References Cited

U.S. PATENT DOCUMENTS

| | | | |
|---|---|---|---|
| 4,963,440 | A | 10/1990 | Shimogori et al. |
| 5,563,422 | A | 10/1996 | Nakamura et al. |

(Continued)

FOREIGN PATENT DOCUMENTS

| | | | |
|---|---|---|---|
| JP | 01287625 | A | 11/1989 |
| JP | 201196574 | A | 7/2001 |
| KR | 100252947 | B1 | 4/2000 |

OTHER PUBLICATIONS

Lee et al. "Long-Term Oxidation Properties of Al—Ti—Cr Two Phase Alloys as Coating Materials for TiAl Alloys" Intermetallics 10 (2002) 347-352.
(Continued)

*Primary Examiner* — Eduardo A Rodela
*Assistant Examiner* — Christopher M Roland
(74) *Attorney, Agent, or Firm* — LaBatt, LLC

(57) ABSTRACT

A contact to a semiconductor including sequential layers of Cr, Ti, and Al is provided, which can result in a contact with one or more advantages over Ti/Al-based and Cr/Al-based contacts. For example, the contact can: reduce a contact resistance; provide an improved surface morphology; provide a better contact linearity; and/or require a lower annealing temperature, as compared to the prior art Ti/Al-based contacts.

20 Claims, 11 Drawing Sheets

Related U.S. Application Data is a continuation-in-part of application No. 12/102,408, filed on Apr. 14, 2008, now Pat. No. 8,766,448.

(60) Provisional application No. 60/937,054, filed on Jun. 25, 2007.

(51) Int. Cl.

| | | |
|---|---|---|
| *H01L 21/283* | (2006.01) | |
| *H01L 31/0224* | (2006.01) | |
| *H01L 33/40* | (2010.01) | |
| *H01S 5/042* | (2006.01) | |
| *H01S 5/30* | (2006.01) | |
| *H01L 23/482* | (2006.01) | |
| *H01L 23/00* | (2006.01) | |
| *H01L 33/62* | (2010.01) | |

(52) U.S. Cl.
CPC .............. *H01L 29/43* (2013.01); *H01L 29/45* (2013.01); *H01L 29/452* (2013.01); *H01L 29/456* (2013.01); *H01L 31/022425* (2013.01); *H01L 33/40* (2013.01); *H01L 33/405* (2013.01); *H01S 5/0425* (2013.01); *H01S 5/3013* (2013.01); *H01L 33/62* (2013.01); *H01L 2224/03848* (2013.01); *H01L 2224/051* (2013.01); *H01L 2224/0508* (2013.01); *H01L 2224/05019* (2013.01); *H01L 2224/05084* (2013.01); *H01L 2224/05116* (2013.01); *H01L 2224/05124* (2013.01); *H01L 2224/05155* (2013.01); *H01L 2224/05157* (2013.01); *H01L 2224/05166* (2013.01); *H01L 2224/05169* (2013.01); *H01L 2224/05171* (2013.01); *H01L 2224/05644* (2013.01); *H01L 2924/1033* (2013.01); *H01L 2924/10323* (2013.01); *H01L 2924/10334* (2013.01); *H01L 2924/10344* (2013.01); *H01L 2924/12032* (2013.01); *H01L 2924/12036* (2013.01); *H01L 2924/12041* (2013.01); *H01L 2924/12042* (2013.01); *H01L 2924/1306* (2013.01); *H01L 2933/0016* (2013.01)

(56) References Cited

U.S. PATENT DOCUMENTS

| | | |
|---|---|---|
| 6,399,988 B1 | 6/2002 | Yamazaki |
| 6,653,215 B1 | 11/2003 | Brown et al. |
| 6,686,610 B2 | 2/2004 | Sheu |
| 8,766,448 B2 | 7/2014 | Gaska et al. |
| 2002/0145166 A1 | 10/2002 | Kachelmeier |
| 2004/0056251 A1 | 3/2004 | Kim et al. |
| 2005/0224813 A1 | 10/2005 | Liu et al. |
| 2006/0270206 A1 | 11/2006 | Cho et al. |
| 2007/0102727 A1 | 5/2007 | Twynam |

OTHER PUBLICATIONS

Mohammed et al., "Anatomy-performance correlation in Ti-based contact metallizations on AlGaN/GaN heterostructures", J. Appl. Phys. 101, Feb. 7, 2007, 15 pgs.

PCT/US2008/067873; PCT International Search Report and Written Opinion; Feb. 27, 2009; 11 pages.

Papanicolaou et al.; Cr/Al and Cr/Al/Ni/Au ohmic contacts to n-type GaN; Journal of Applied Physics, vol. 87, No. 1, Jan. 2000, pp. 380-386.

Papanicolaou et al.; A High Temperature Vacuum Annealing Method for Forming Ohmic Contacts to GaN and SiC; Fourth International High Temperature Electronic Conference, Jun. 1998, pp. 122-127.

Schmitz et al.;Schottky barrier properties of various metals on n-type GaN; Semiconductor Science and Technology, vol. 11, No. 10, Oct. 1996. pp. 1464-1467.

Schmitz et al; Metal Contacts to n-Type GaN; Journal of Electronic Materials; vol. 27, No. 4, Apr. 1998, pp. 255-260.

Shao et al. "On the omega Phase Formation in Cr—Al and Ti—Al—Cr Alloys" Acta Mater. 48 (2000) 3671-3685.

Roland, Christopher M., U.S. Appl. No. 12/102,408, Notice of Allowance Feb. 28, 2014, 11 pages.

Roland, Christopher M., U.S. Appl. No. 12/102,408, Non-Final Rejection Jun. 3, 2013, 19 pages.

Roland, Christopher M., U.S. Appl. No. 12/102,408, Final Rejection Jan. 10, 2013, 18 pages.

Roland, Christopher M., U.S. Appl. No. 12/102,408, Non-Final Rejection May 25, 2012, 16 pages.

Roland, Christopher M., U.S. Appl. No. 12/102,408, Non-Final Rejection Oct. 12, 2011, 16 pages.

Roland, Christopher M., U.S. Appl. No. 12/102,408, Final Rejection Jul. 6, 2011, 14 pages.

Roland, Christopher M., U.S. Appl. No. 12/102,408, Non-Final Rejection Dec. 17, 2010, 15 pages.

Roland, Christopher M., U.S. Appl. No. 14/316,907, Notice of Allowance Feb. 27, 2015, 10 pages.

Roland, Christopher M., U.S. Appl. No. 14/316,907, Notice of Allowance Jan. 26, 2015, 13 pages.

CCD picture of Cr/Ti/Al-based contact for 280 nm UVLED

CCD picture of Ti/Al-based contact for 280 nm UVLED

CCD picture of Cr/Ti/Al-based contact for HFET

CCD picture of Ti/Al-based contact for HFET

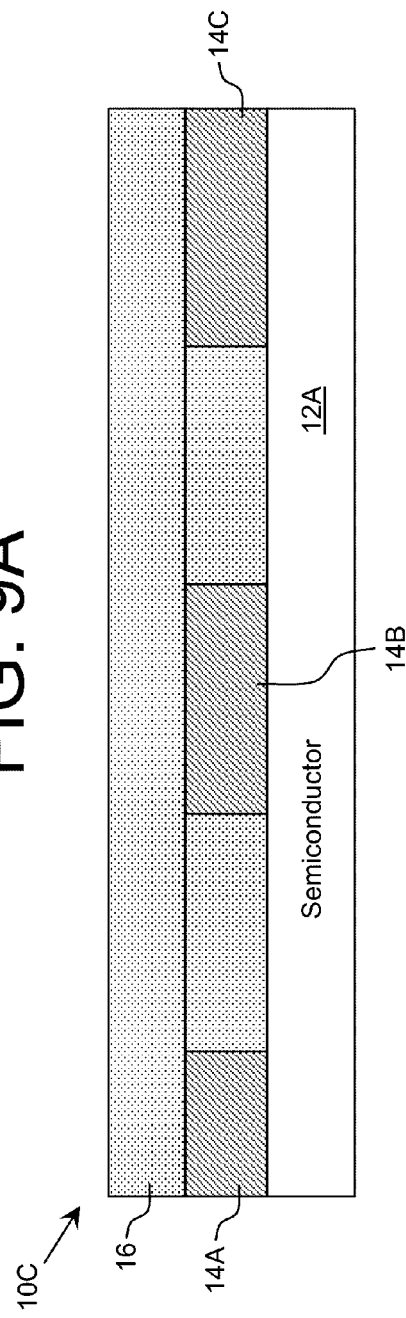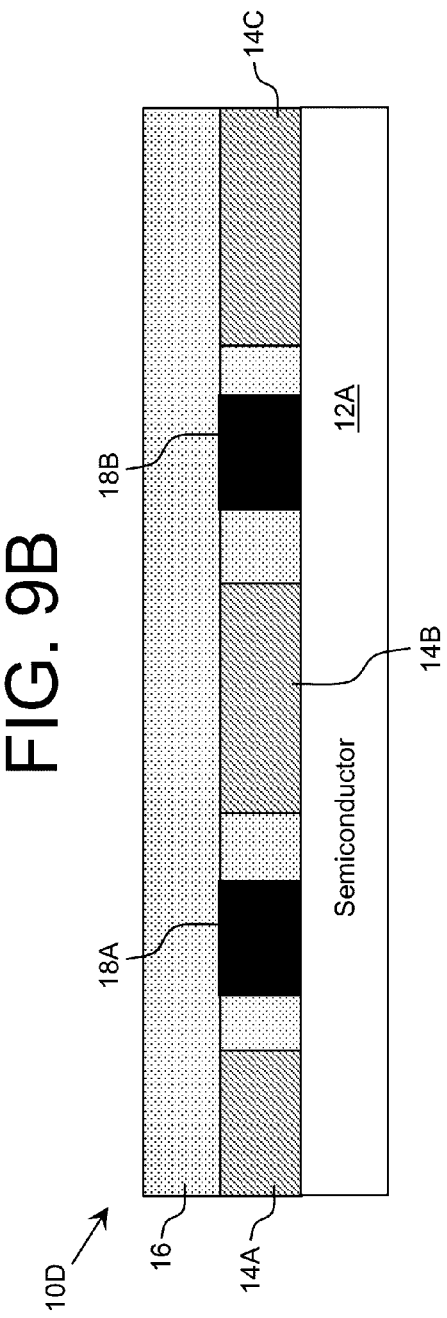

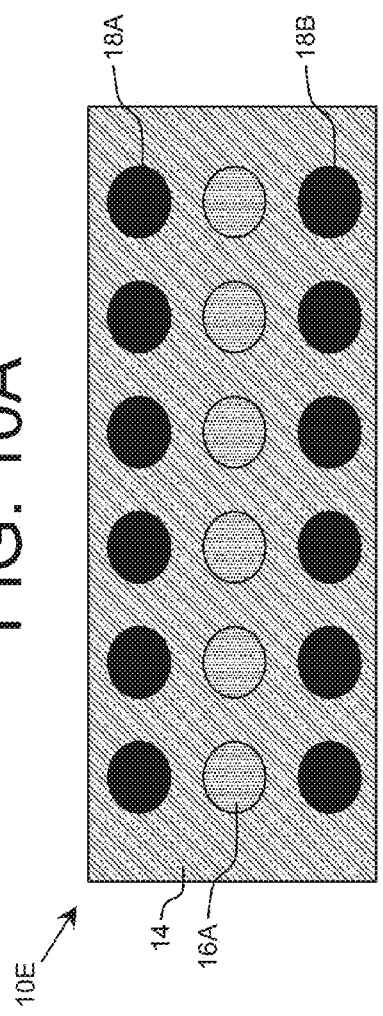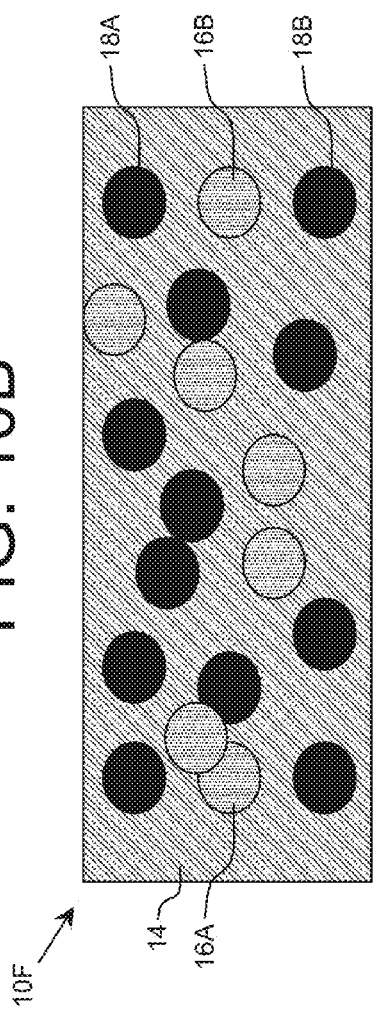

CHROMIUM/TITANIUM/ALUMINUM-BASED SEMICONDUCTOR DEVICE CONTACT FABRICATION

REFERENCE TO PRIOR APPLICATIONS

The current application is a continuation-in-part of U.S. application Ser. No. 14/316,907, which was filed on 27 Jun. 2014, and which is a continuation-in-part of U.S. application Ser. No. 12/102,408, titled "Chromium/Titanium/Aluminum-based Semiconductor Device Contact," which was filed on 14 Apr. 2008, and which claims the benefit of U.S. Provisional Application No. 60/937,054, titled "Contact for semiconductor devices," which was filed on 25 Jun. 2007, each of which is hereby incorporated by reference.

TECHNICAL FIELD

The disclosure relates generally to device contacts, and more particularly, to contacts for a semiconductor device, such as a Gallium Nitride semiconductor device.

BACKGROUND ART

The formation of a contact for a semiconductor device is an important process in fabricating the semiconductor device. For example, contact resistance significantly affects the performance characteristics of the semiconductor device. As a result, achieving a low contact resistance is typically desired. Other important characteristics include contact stability, surface morphology, reliability, and linearity, especially at large currents.

In order to achieve a low contact resistance for Gallium Nitride (GaN) devices, several contact metals and a relatively high annealing temperature are typically utilized to form the contact. Aluminum (Al) is widely used in ohmic contacts because of its low melting point of 660 degrees Celsius. Additionally, Titanium (Ti) or Chromium (Cr) is used as the first layer for the contact because of its low metal work function to GaN. For example, one approach forms a Ti/Al-based contact to an n-type GaN semiconductor having several metals, such as Ti/Al/Ti/Gold (Au) or Ti/Al/Nickel (Ni)/Au, a thickness from five nanometers to five microns, and which is annealed at 400 degrees Celsius or more. A different approach reverses the order of Ti and Al, and forms an Al/Ti-based contact to an n-type GaN semiconductor that includes Al/Ti/Platinum (Pt)/Au and is annealed at temperatures between 400 and 600 degrees Celsius. Other approaches form a Cr/Al-based contact to an n-type GaN semiconductor that include various metal configurations, such as Cr/Al/Cr/Au, Cr/Al/Pt/Au, Cr/Al/Lead (Pd)/Au, Cr/Al/Ti/Au, Cr/Al/Cobalt (Co)/Au, and Cr/Al/Ni/Au.

To date, a Ti/Al-based contact yields a lower contact resistance than a Cr/Al-based contact, while requiring a higher temperature annealing for the contact alloy. However, the Ti/Al-based n-contact is not reliable for 265 nanometer (nm) and shorter wavelength ultraviolet (UV) light emitting diodes (LEDs). The Cr/Al-based contact has a lower annealing temperature, but a higher contact resistance, than the Ti/Al-based contact. Because of the lower annealing temperature, the surface morphology of the Cr/Al-based contact is better than that of the Ti/Al-based contact.

Various research has been devoted to improving the Ti/Al-based contacts and the Cr/Al-based contacts.

SUMMARY OF THE INVENTION

Aspects of the invention provide a novel Cr/Ti/Al-based contact to a semiconductor, which includes sequential layers of Cr, Ti, and Al. In an embodiment, a contact including a Cr/Ti/AI alloy is provided, which can result in a contact that provides numerous advantages, including at least some of those of the prior art Ti/Al-based and Cr/Al-based contacts. The resulting contact can have one or more advantages over Ti/Al-based and Cr/Al-based contacts. For example, the contact can: reduce a contact resistance; provide an improved surface morphology; provide a better contact linearity; and/or require a lower annealing temperature, as compared to the prior art Ti/Al-based contacts.

A first aspect of the invention provides a contact to a semiconductor comprising: Chromium; Titanium directly on the Chromium; and Aluminum directly on the Titanium.

A second aspect of the invention provides a semiconductor device comprising: a semiconductor structure having an exposed surface and a semiconductor below the exposed surface; and a contact to the semiconductor, the contact including: Chromium over the exposed surface; Titanium directly on the Chromium; and Aluminum directly on the Titanium.

A third aspect of the invention provides a method of fabricating a semiconductor device, the method comprising: obtaining a semiconductor structure having an exposed surface and a semiconductor below the exposed surface; and forming a contact to the semiconductor, the contact including: Chromium over the exposed surface; Titanium directly on the Chromium; and Aluminum directly on the Titanium.

A fourth aspect of the invention provides an integrated circuit comprising: a first semiconductor device including: a semiconductor structure having an exposed surface and a semiconductor below the exposed surface; and a first contact to the semiconductor, the first contact including: Chromium over the exposed surface; Titanium directly on the Chromium; and Aluminum directly on the Titanium; and a second device having a second contact, wherein the first contact provides an interconnect to the second contact.

Other aspects of the invention provide methods, systems, and methods of using and generating each, which include and/or implement some or all of the actions described herein. The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

FIGS. 9A and 9B show side views of illustrative contacts according to embodiments.

FIGS. 10A and 10B show bottom views of illustrative contacts according to embodiments.

It is noted that the drawings are not to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As indicated above, aspects of the invention provide a novel Cr/Ti/Al-based contact to a semiconductor, which includes sequential layers of Cr, Ti, and Al. In an embodiment, a contact including a Cr/Ti/Al alloy is provided, which can result in a contact with the combined advantages of the prior art Ti/Al-based and Cr/Al-based contacts. The resulting contact can have one or more advantages over Ti/Al-based and Cr/Al-based contacts. For example, the contact can: reduce a contact resistance; provide an improved surface morphology; provide a better contact linearity; and/or require a lower annealing temperature, as compared to the prior art Ti/Al-based contacts. As used herein, unless otherwise noted, the phrase "any solution" means any now known or later developed solution.

Figure 1B:
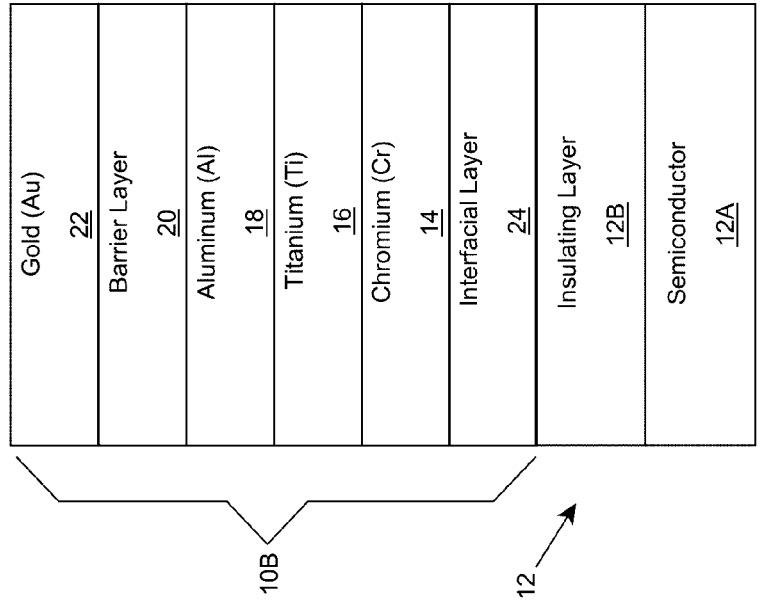
FIGS. 1A-B show illustrative contacts according to embodiments.
Figure 1A:
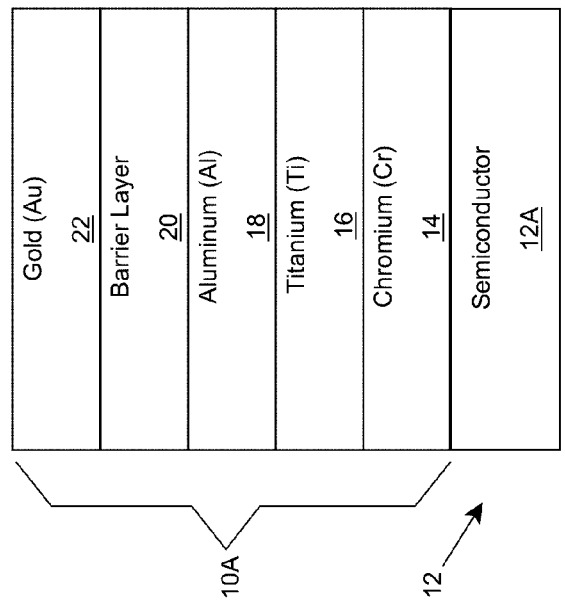

Turning to the drawings, FIGS. 1A-B show illustrative contacts 10A-B, respectively, according to embodiments. As illustrated, contacts 10A-B are formed on an exposed surface of a semiconductor structure 12. Semiconductor structure 12 can comprise at least one layer that comprises a semiconductor 12A. For example, semiconductor structure 12 can comprise one or more layers/regions of: a binary, ternary, or quaternary group III-V material (e.g., AlN, GaN, InN, and/or the like) or alloy(s) thereof; diamond; any carbon modification; silicon carbide (including all polytypes or mixtures thereof); silicon; germanium; a silicon germanium alloy; and/or the like. Further, semiconductor structure 12 may include one or more layers/regions of insulating material, metals, and/or the like. The precise configuration of layers/regions can be selected to obtain desired operating characteristic(s) of a resulting semiconductor device using any solution. In an embodiment, semiconductor 12A comprises an n-type semiconductor material. In a further embodiment, the n-type semiconductor material is a GaN-based semiconductor material, such as AlGaN, an AlGaN/GaN heterostructure, or the like. In a still further embodiment, semiconductor 12A can comprise a layer, such as an AlGaN layer, having a high Al composition.

Each contact 10A-B is a contact to semiconductor 12A, which is disposed below contact 10A-B. Contact 10A or 10B can be formed directly on an exposed surface of semiconductor 12A as illustrated by contact 10A in FIG. 1A. Alternatively, contact 10A or 10B can be formed on an exposed surface of a layer that is disposed between semiconductor 12A and contact 10A or 10B. To this extent, as illustrated by contact 10B in FIG. 1B, contact 10A or 10B can comprise a contact to a metal-insulator semiconductor structure. In particular, contact 10A or 10B can be formed on an insulating layer 12B, which is disposed between semiconductor 12A and contact 10B. Insulating layer 12B can comprise any type of insulating material, such as silicon dioxide, silicon nitride, aluminum oxide, aluminum nitride, and/or the like. Alternatively, another type of layer can separate contact 10A or 10B from semiconductor 12A, such as a thin semiconductor layer or the like. An illustrative thin semiconductor layer can comprise a thin layer of aluminum nitride, silicon, or the like.

In any event, contacts 10A-B can be formed on an exposed surface of a layer (semiconductor, insulating, or the like) of semiconductor structure 12 using any solution. For example, semiconductor structure 12 having the exposed surface can be obtained using any solution (e.g., manufactured, purchased, prepared, and/or the like). Subsequently, contact 10A can be formed on the exposed surface using any solution. For example, Chromium 14 can be deposited directly on the exposed surface using any solution, Titanium 16 can be deposited directly on Chromium 14, and Aluminum 18 can be deposited directly on Titanium 16. Additionally, a barrier layer 20 can be formed (e.g., deposited) directly on Aluminum 18, and Gold 22 can be deposited directly on barrier layer 20. Barrier layer 20 can comprise any metal, such as Titanium, Chromium, Nickel, Cobalt, Platinum, Lead, Molybdenum, Tungsten, or the like, or alloys thereof. The thickness of each metal in contact 10A can vary between approximately 10 Angstroms and approximately 1 micron.

Similarly, contact 10B can be formed on an exposed surface of semiconductor structure 12 using any solution. For example, an interfacial layer 24 can be formed (e.g., deposited) directly on the exposed surface using any solution, Interfacial layer 24 can provide an insulating layer on which contact 10B is formed. Interfacial layer 24 can comprise a semi-metal, a semiconductor having an energy gap that is smaller than an energy gap of the material to which contact 10B is made (e.g., semiconductor 12A), an amorphous material, a doped (e.g., highly doped) semiconductor, a semiconductor superlattice, and/or the like. In an embodiment, interfacial layer 24 comprises aluminum gallium nitride. Interfacial layer 24 can have a thickness between approximately 10 Angstroms and approximately 1 micron. The remainder of contact 10B can be formed on interfacial layer 24 in the same manner as described for contact 10A.

Either contact 10A-B can comprise an ohmic contact or a Schottky contact. Additionally, either contact 10A-B can comprise a contact to a p-type or n-type semiconductor 12A. Further, the formation of contact 10A-B can include annealing the contact 10A-B to improve the contact performance. In an embodiment, the annealing is performed at a temperature between approximately 500 degrees Celsius and approximately 1100 degrees Celsius, and will vary based on the composition of semiconductor structure 12, among other factors.

Contact 10A-B and semiconductor structure 12 can be implemented as part of various types of semiconductor devices using any solution. To this extent, contact 10A-B can be used in wide band gap semiconductor technology and semiconductor devices, such as those used in microwave amplifiers, oscillators, switchers, and/or the like, as well as optoelectronic devices. For example, illustrative types of devices include a light emitting diode (LED), a laser, a field effect transistor (FET), a solar cell, a charge coupled device, a Schottky diode, a p-n junction diode, and/or the like. Further, a device fabricated with contact 10A-B can be implemented in an integrated circuit, in which contact 10A-B provides an interconnect to a contact for another device in the circuit.

The contact described herein has been implemented on several devices using several alternative embodiments and evaluated with respect to prior art Ti/Al-based contacts. The evaluation has shown that embodiments of the contact can: reduce a contact resistance; provide an improved surface morphology; provide a better contact linearity; and/or require a lower annealing temperature, as compared to the prior art Ti/Al-based contacts.

For example, when implemented as a contact to an AlGaN semiconductor with a relatively high molar fraction of Al (e.g., a molar fraction of Al that is more than 50%), an embodiment of the contact described herein can reduce a contact resistance and/or provide a more uniform contact resistance than a Ti/Al-based contact. The AlGaN semiconductor with a relatively high molar fraction of Al is commonly used for deep Ultraviolet (UV) LEDs that emit electromagnetic radiation having a wavelength between approximately 255 nm and 265 nm.

Figure 2:
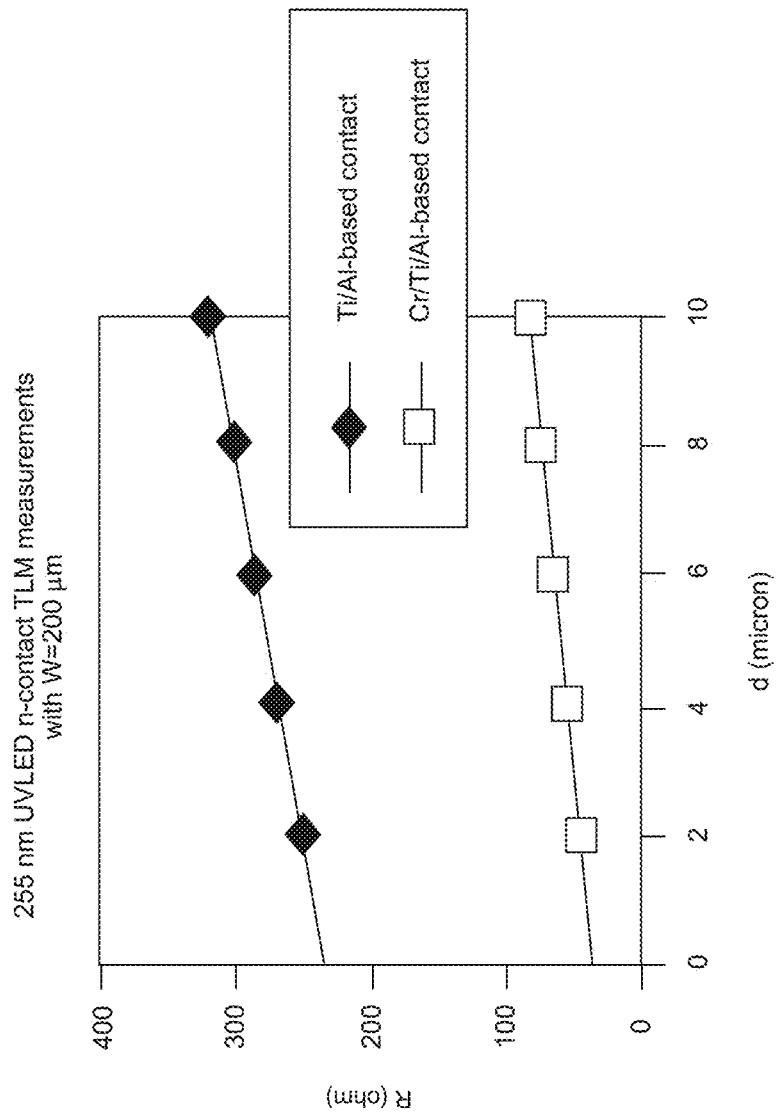
FIG. 2 shows illustrative n-contact transmission line method (TLM) measurement results of a 255 nm UV LED having a width (W) of 200 μm according to an embodiment.
Figure 3:
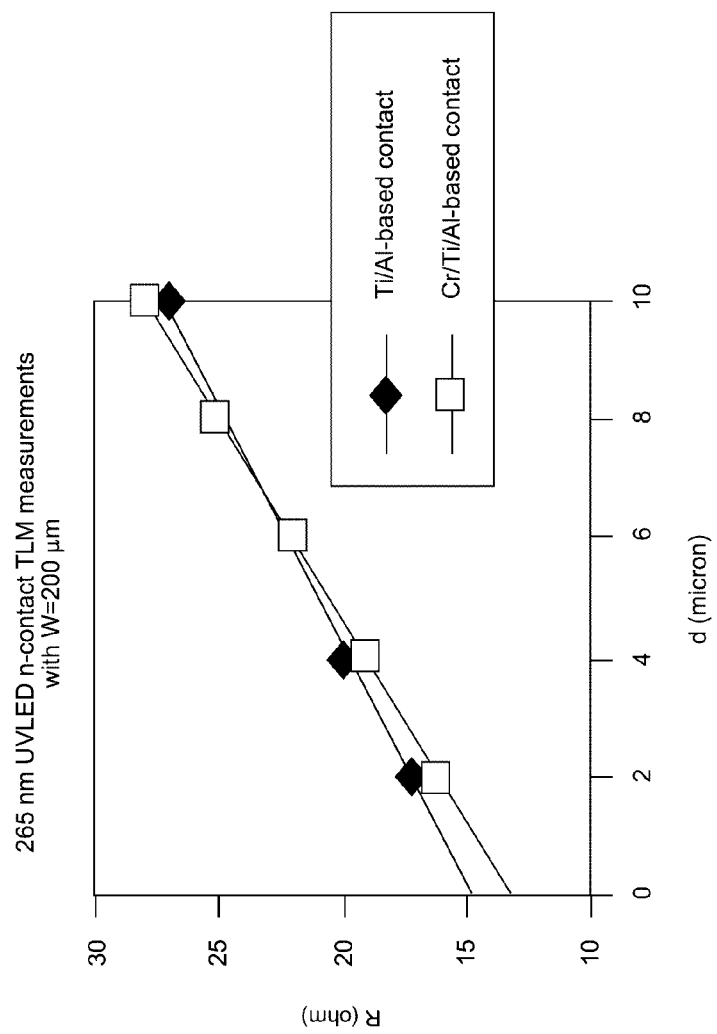
FIG. 3 shows illustrative n-contact TLM measurement results of a 265 nm UV LED having a width (W) of 200 μm according to an embodiment.
Figure 4:
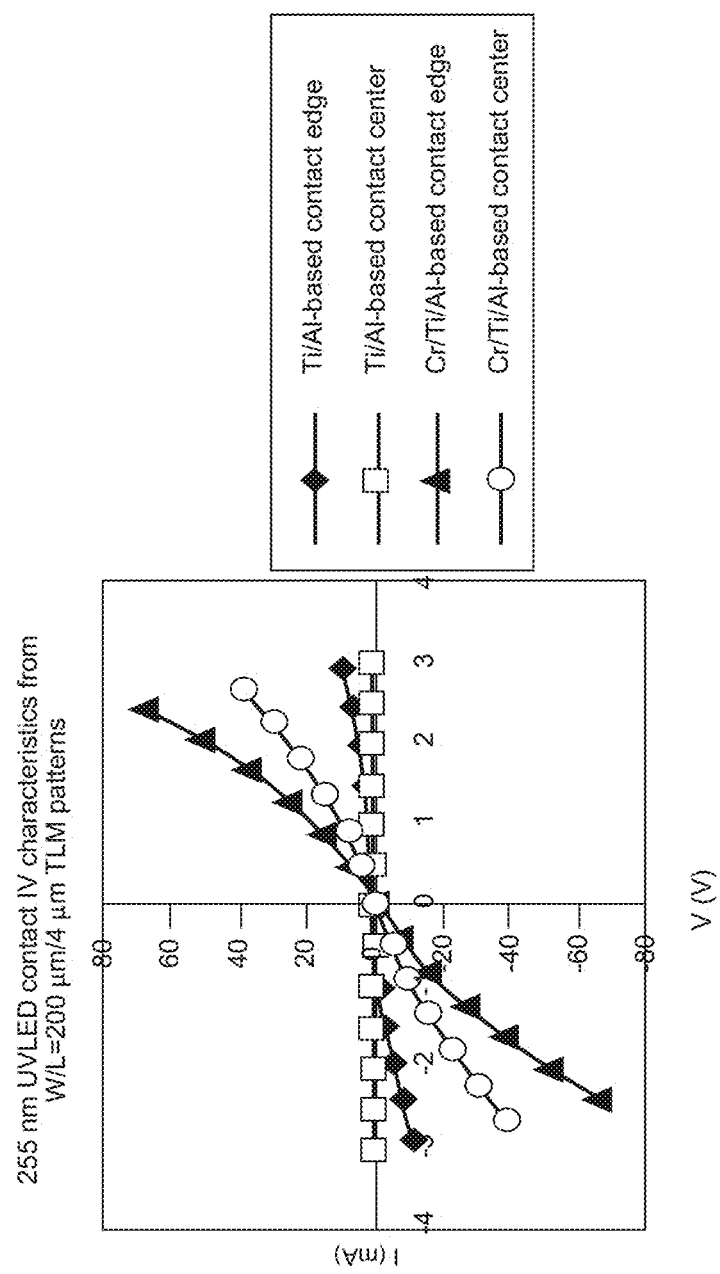
FIG. 4 shows illustrative n-contact edge and center TLM current-voltage (IV) characteristic measurements for a 255 nm UV LED having a width/length (W/L) of 200 μm/4 μm according to an embodiment.

To this extent, FIG. 2 shows illustrative n-contact TLM measurement results of a 255 nm UV LED having a width (W) of 200 μm according to an embodiment. As illustrated, the n-contact resistivity was approximately 3.6 Ω-mm for the Cr/Ti/Al-based contact, and approximately 23.4 Ω-mm for the Ti/Al-based contact. To this extent, the Cr/Ti/Al-based contact reduced the contact resistance by approximately 84.6%. FIG. 3 shows illustrative n-contact TLM measurement results of a 265 nm UV LED having a width (W) of 200 μm according to an embodiment. In this case, the n-contact resistivity was approximately 1.3 Ω-mm for the Cr/Ti/Al-based contact and approximately 1.5 Ω-mm for the Ti/Al-based contact, which results in an approximately 13.3% reduction in contact resistance. Additionally, FIG. 4 shows illustrative n-contact edge and center TLM IV characteristic measurements for a 255 nm UV LED having a width/length (W/L) of 200 μm/4 μm according to an embodiment. As illustrated, the resistance of an embodiment of the Cr/Ti/Al-based contact is more uniform than that of the Ti/Al-based contact.

Figure 5:
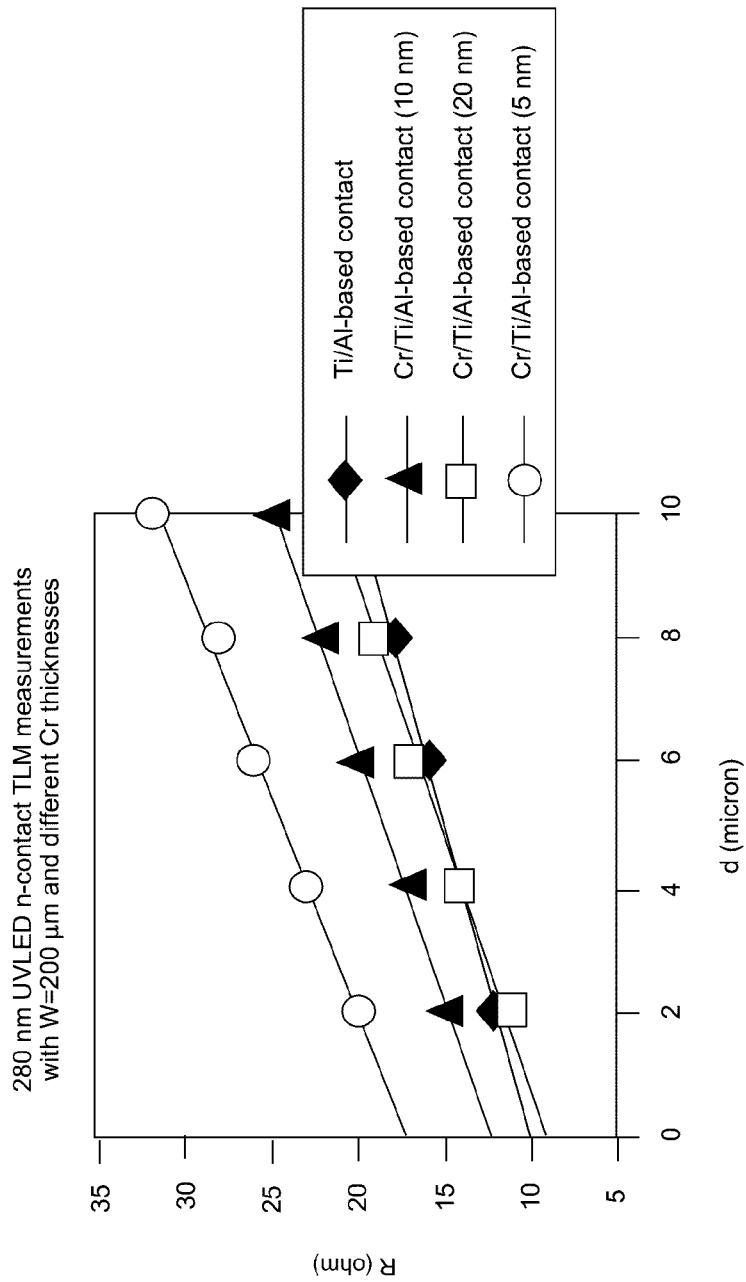
FIG. 5 shows illustrative n-contact TLM measurement results of a 280 nm UV LED having a width (W) of 200 μm and different Cr thicknesses according to embodiments.

For UV LEDs that emit radiation having a wavelength between approximately 265 nm and 295 nm, the contact resistance for an embodiment of Cr/Ti/Al-based contact was similar to the contact resistance for Ti/Al-based contacts. For example, as shown in FIG. 3, the Cr/Ti/Al-based contact provided a slight improvement in contact resistance for a Ti/Al-based contact for a 265 nm UV LED. FIG. 5 shows illustrative n-contact TLM measurement results of a 280 nm UV LED having a width (W) of 200 μm and different Cr thicknesses according to embodiments. As illustrated, the contact resistivity is approximately: 1.7 Ω-mm for a Cr thickness of 5 nm; 1.2 for a Cr thickness of 10 nm; and 0.9 for a Cr thickness of 20 nm. While the contact resistivity improved with the Cr thickness, the 20 nm Cr thickness requires a longer annealing time.

Figure 6B:
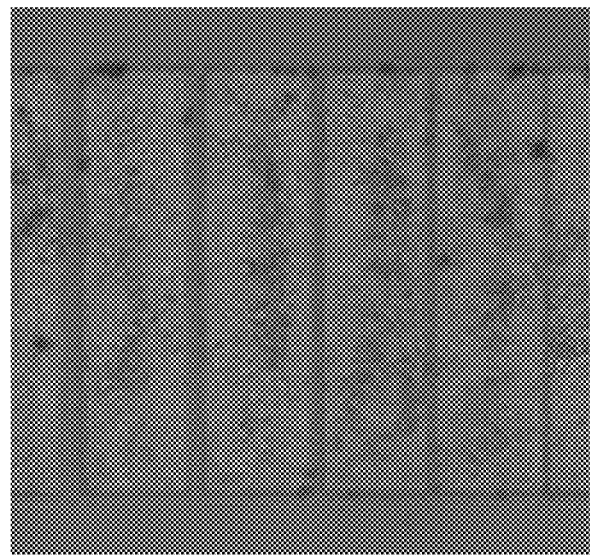
FIGS. 6A-B show illustrative CCD pictures of Ti/Al-based contacts and Cr/Ti/Al-based contacts, respectively, for a 280 nm UV LED according to an embodiment.
Figure 6A:
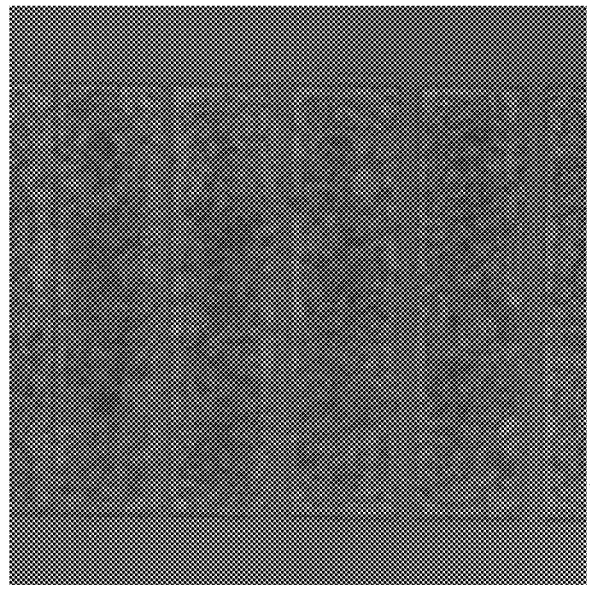

The annealing temperature for embodiments of the Cr/Ti/Al-based contact are also similar to that of Ti/Al-based n-contacts for 265 nm to 295 nm UV LEDs. However, embodiments of the Cr/Ti/Al-based contact showed an improved surface morphology over that of a Ti/Al-based contact. To this extent, FIGS. 6A-B show illustrative CCD pictures of Ti/Al-based contacts and Cr/Ti/Al-based contacts, respectively, for a 280 nm UV LED according to an embodiment. As illustrated, the image of the Cr/Ti/Al-based contacts (FIG. 6B) is a lighter color than the image of the Ti/Al-based contacts (FIG. 6A). The lighter color results from more reflected light from a more uniform surface. This is an indication of improved morphology of the Cr/Ti/Al-based contacts over that of the Ti/Al-based contacts.

For n-GaN-based blue LEDs, the annealing temperature is between 400 degrees Celsius to 600 degrees Celsius for Ti/Al-based contacts. However, a higher Al composition in UV LEDs requires a higher annealing temperature for forming an ohmic contact. For example, for n-type AlGaN UV LEDs that emit radiation having a wavelength between approximately 330 nm and 365 nm, a Ti/Al-based contact requires an annealing temperature of approximately 850 degrees. Embodiments of the Cr/Ti/Al-based n-contacts for 330 nm to 365 nm UV LEDs require a lower annealing temperature, e.g., approximately 700 degrees Celsius. For low-Al concentration AlGaN materials, such as those used in green LEDs, blue LEDs, and in field effect transistors, both the Ti/Al-based and Cr/Ti/Al-based contacts give satisfactory results.

Table 1 below compares the annealing temperatures for Ti/Al and Cr/Ti/Al-based contacts to AlGaN with different molar fractions of Aluminum (e.g., in UV LEDs generating radiation of different wavelengths). Similarly, Table 2 compares the contact resistances of Ti/Al and Cr/Ti/Al-based contacts to AlGaN with different molar fractions of Aluminum. As illustrated, Cr/Ti/Al-based contacts have lower resistances compared to Ti/Al-based contacts for deep UV LEDs (255-265 nm). The advantage is more pronounced for shorter wavelengths. Additionally, the Cr/Ti/Al-based contacts have lower annealing temperatures compared to Ti/Al-based contacts for longer wavelength UV LEDs (330-365 nm). Still further, the current-voltage (IV) characteristics of Cr/Ti/Al yield a low contact resistance for all researched UV LEDs (e.g., 255-365 nm).

TABLE 1 n-contact anneal temperatures

| | Wavelength | | | | |
|---|---|---|---|---|---|
| | 365 nm | 340 nm | 295 nm | 280 nm | 265 nm | 255 nm |
| Ti/Al-contact | 850° C. | 850° C. | 900° C. | 900° C. | 900° C. | 950° C. |
| Cr/Ti/Al-contact | 700° C. | 700° C. | 900° C. | 900° C. | 900° C. | 950° C. |

TABLE 2 n-contact resistance

| | Wavelength | | | | |
|---|---|---|---|---|---|
| | 365 nm | 340 nm | 295 nm | 280 nm | 265 nm | 255 nm |
| Ti/Al-contact (Ω · mm) | 0.18 | 0.24 | 0.56 | 1.00 | 1.5 | 23.4 |
| Cr/Ti/Al-contact (Ω · mm) | 0.75 | 0.49 | 0.78 | 1.23 | 1.3 | 3.6 |

Figure 7:
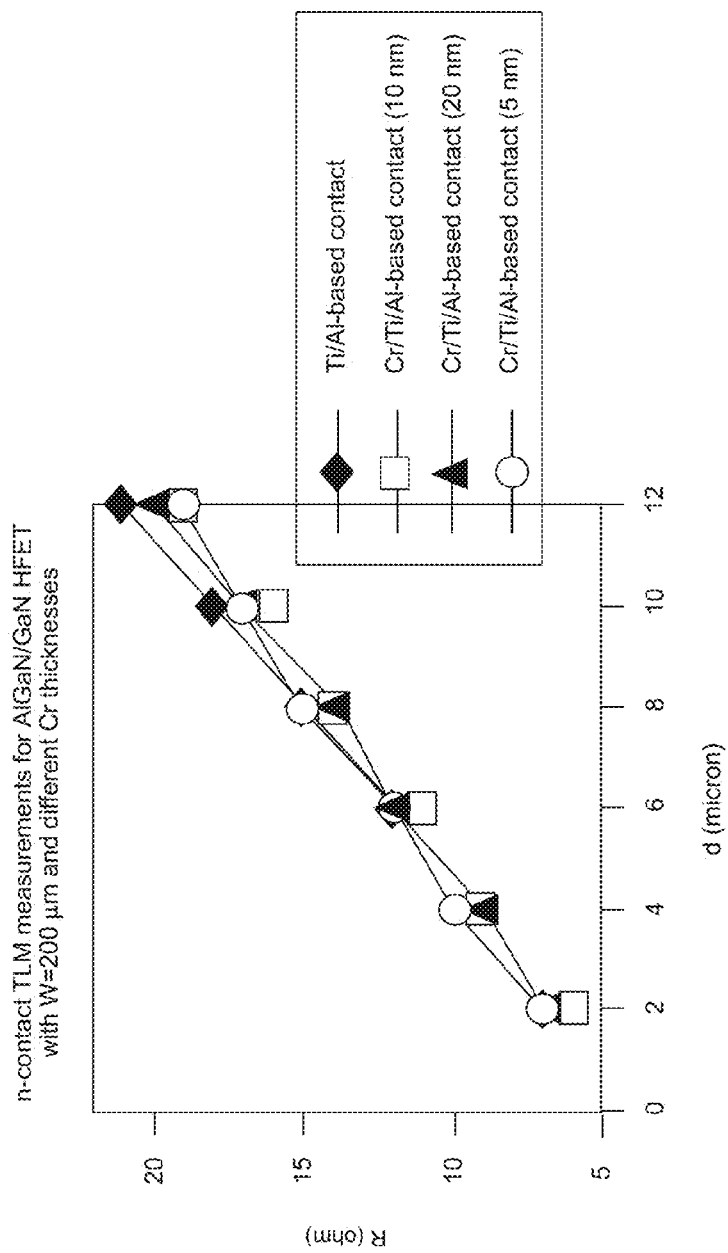
FIG. 7 shows illustrative n-contact TLM measurement results for a field effect transistor having a width (W) of 200 µm and different Cr thicknesses according to embodiments.

As previously described, the Cr/Ti/Al-based contact can be implemented on various types of devices in addition to UV LEDs. For example, embodiments of the Cr/Ti/Al-based contact have been used for an AlGaN/GaN HFET n-contact process. To this extent, FIG. 7 shows illustrative n-contact TLM measurement results for a field effect transistor having a width (W) of 200 μm and different Cr thicknesses according to embodiments. As illustrated, the contact resistivity is approximately: 0.5 Ω-mm for a Cr thickness of 5 nm; 0.36 for a Cr thickness of 10 nm; and 0.4 for a Cr thickness of 20 nm. While the contact resistance could be smaller than that of the Ti/Al-based contact, any difference is not large.

Figure 8B:
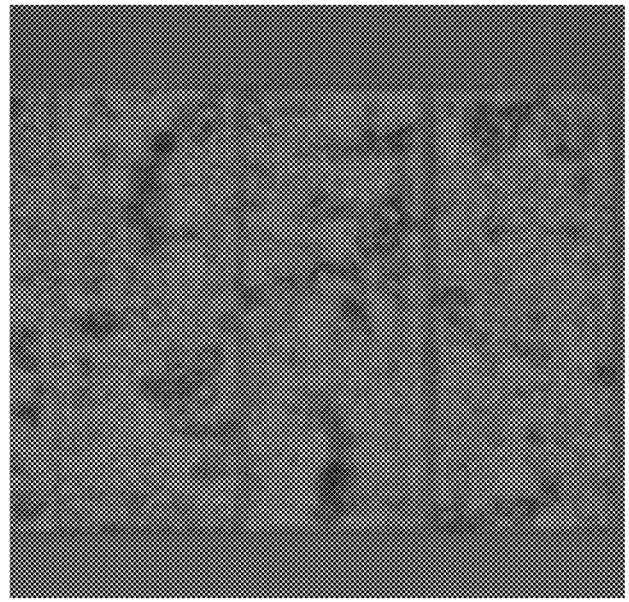
FIGS. 8A-B show illustrative charge-coupled device (CCD) pictures of Ti/Al-based contacts and Cr/Ti/Al-based contacts, respectively, for a heterostructure field effect transistor (HFET) according to an embodiment.
Figure 8A:
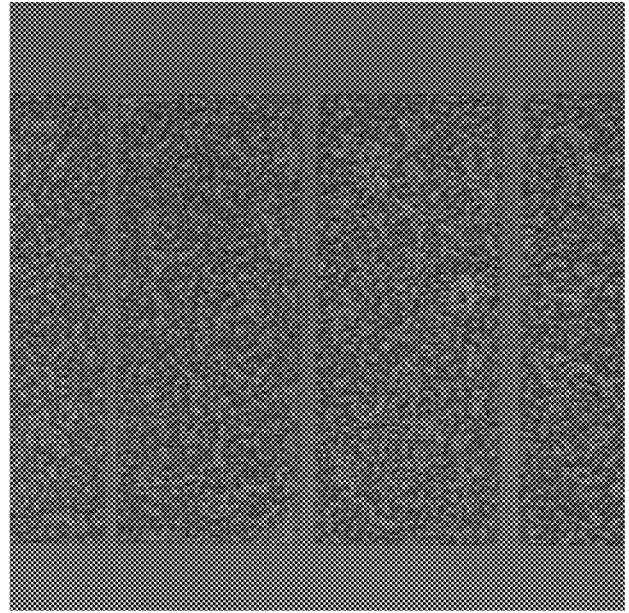

However, the Cr/Ti/Al-based contact can provide an improved alloy morphology over that of Ti/Al contacts due to the lower annealing temperature. For example, FIGS. 8A-B show illustrative CCD pictures of Ti/Al-based contacts and Cr/Ti/Al-based contacts, respectively, for an HFET according to an embodiment. As illustrated, the image of the Cr/Ti/Al-based contacts (FIG. 8B) is a lighter color than the image of the Ti/Al-based contacts (FIG. 8A). The lighter color results from more reflected light from a more uniform surface. This is an indication of improved morphology of the Cr/Ti/Al-based contacts over that of the Ti/Al-based contacts.

Further, as previously discussed with reference to FIG. 4, the contact resistance (e.g., voltage divided by current) for Cr/Ti/Al-based contact is more uniform from edge to center than that of the Ti/Al-based contact. As a result of the better contact quality, a device, such as an HFET or a UV LED, including Cr/Ti/Al-based contact(s) may have an improved thermal stability for the contact(s) and an improved operational lifetime as compared to that provided by the Ti/Al-based contact(s).

Returning to FIGS. 1A and 1B, in an embodiment, fabrication of a Cr/Ti/Al-based contact 10A, 10B as described herein can result in a discontinuous Chromium layer 14. In this case, portions of the underlying material, such as the semiconductor 12A and/or interfacial layer 24, will directly contact the Titanium layer 16, while other portions will include the intervening Chromium layer 14. For example, the Chromium layer 14 can be deposited and/or annealed during fabrication of the contact 10A, 10B using a solution, which results in formation of disconnected islands of Chromium on the underlying material and/or disconnected islands of the underlying material extending above the Chromium layer 14.

In an illustrative embodiment, a surface roughness of the semiconductor layer 12A and/or the interfacial layer 24 is in a range between approximately twenty nm and approximately thirty nm. A total thickness of each of the Chromium layer 14 and the Titanium layer 16 can be in a range between approximately ten and approximately twenty nm, with a total thickness of the Chromium layer 14 and Titanium layer 16 being close to the surface roughness of the semiconductor layer 12A and/or the interfacial layer 24. When formed using, for example, e-beam deposition, the relatively thin Chromium layer 14 and Titanium layer 16 will not cover the corresponding surface of the semiconductor layer 12A or the interfacial layer 24 uniformly. Subsequently, during annealing, such as a high temperature annealing higher than approximately 850° C., Aluminum in the Aluminum layer 18 will alloy with the Titanium and Chromium, forming TiAl and CrAl alloys, which result in a discontinuous Chromium layer 14.

As described herein, the semiconductor 12A can comprise a group III nitride material having a high Aluminum content. For example, the semiconductor 12A can comprise an $Al_xGa_{1-x}N$ layer of material where x is greater than approximately 0.3. In a more particular embodiment, such a layer of material can be included in a deep ultraviolet LED. Illustrative semiconductors 12A include: an AlGaN layer having an aluminum content of approximately 0.3 for a 360 nanometer LED and an AlGaN layer having an aluminum content of approximately 0.5 for a 280 nanometer LED, and an AlGaN layer having an aluminum content of approximately 0.6 for a 260 nanometer LED. For shorter wavelength group III nitride-based UV LEDs, the aluminum content is increased from 0.3 to 0.8 to obtain a higher energy band-gap of the materials, which moves the emission wavelength in a range from approximately 360 nm to approximately 230 nm. However, the higher band-gap of the materials increases a work function between a metal for an n-type contact and the semiconductor 12A. The increased work function can cause a poor n-type ohmic contact, and can result in a higher contact resistance. For example, a higher aluminum content in the semiconductor 12A can make formation of a TiN alloy to reduce the metal work function for an ohmic contact more difficult. To this extent, an annealing temperature can be increased to overcome problem(s) presented by a higher aluminum content in the semiconductor 12A.

In an embodiment, the underlying material, such as the semiconductor 12A and/or the interfacial layer 24, can be configured to facilitate formation of the discontinuous Chromium layer 14. For example, prior to forming the contact 10A, 10B, a surface of the semiconductor 12A and/or the interfacial layer 24 can be prepared for the contact formation. In an embodiment, the preparation includes roughening or patterning an exposed surface of the semiconductor 12A and/or the interfacial layer 24 (e.g., using etching or the like) prior to depositing the Chromium layer 14 thereon. In this case, a thickness of the Chromium layer 14 can be selected to allow at least a portion of the roughened surface to extend there through.

A discontinuous Chromium layer 14 can, for example, result in a contact 10A, 10B having improved optical properties over that provided by a contact 10A, 10B with a continuous Chromium layer 14. The improved optical properties can include: an increased light scattering, an increase in reflectivity due to a larger portion of the light being reflected by the more reflective contact layers, such as the Aluminum layer 18, and/or the like.

FIGS. 9A and 9B show side views of illustrative contacts 10C, 10D according to embodiments. As illustrated, the contact 10C includes a discontinuous Chromium layer, which can result in the formation of multiple Chromium islands 14A-14C on a surface of the underlying semiconductor layer 12A. As shown in FIG. 9A, a Titanium layer 16 can be deposited over the Chromium islands 14A-14C, which can result in Titanium penetrating the spacing between the Chromium islands. As a result, a surface of the semiconductor layer 12A can be directly contacted by both Titanium and Chromium. As shown in FIG. 9B, one or more additional metals can directly contact the surface of the semiconductor layer 12A. For example, the contact 10D is shown including a discontinuous Chromium layer forming Chromium islands 14A-14C with islands of Aluminum 18A, 18B located in the spacing between the Chromium islands 14A-14C and the Titanium layer 16 penetrating the spacing between the Chromium islands 14A-14C and Aluminum islands 18A-18B. As a result, a surface of the semiconductor layer 12A can be directly contacted by Titanium, Chromium, and Aluminum.

The various metals can be arranged on the surface of the semiconductor layer 12A using any solution. To this extent, FIGS. 10A and 10B show bottom views (e.g., from the surface of the semiconductor layer 12A) of illustrative contacts 10E, 10F according to embodiments. The metal contacts 10E, 10F are shown including a discontinuous Chromium layer 14, which includes a plurality of openings in which other metal(s) can be located. In FIG. 10A, the openings have a periodic arrangement with two metals located in alternating rows of the openings. For example, the contact 10E can include one or more rows of Titanium 16A filled openings alternating with one or more rows of Aluminum 18A, 18B filled openings. Alternatively, as shown in FIG. 10B, the openings can have a random coverage, with some openings filled with Titanium 16A, 16B and some openings filled with Aluminum 18A, 18B. Depending on the annealing conditions utilized (e.g., temperature, time, and/or the like), other metals also can fill the openings in the Chromium layer 14, such as metals from a higher contact layer (e.g., a buffer layer, a barrier layer, and/or the like).

It is understood that the various discontinuous Chromium layer configurations shown in FIGS. 9A-10B are only illustrative, and other configurations are possible. For example, in an embodiment, different metals other than Titanium and Aluminum can be located within the openings/gaps of the discontinuous Chromium layer. To this extent, in an embodiment, the Titanium penetrating the discontinuous Chromium layer shown in FIG. 9A can be replaced with a different metal, such as Aluminum, selected based on its reflective properties for radiation of a corresponding wavelength. In this case, the surface of the semiconductor layer 12A can be contacted by Aluminum and Chromium, which is covered by the Titanium layer. Similarly, a metal, such a Titanium, can be selected, which provides an improved ohmic contact to the semiconductor layer 12A over that provided by the Chromium. Additionally, it is understood that while FIGS. 9A and 9B show the contacts 10C, 10D located directly on the semiconductor layer 12A, one or more other layers (such as the insulating layer 12B and/or interfacial layer 24 shown in FIG. 1B) can be located between the contacts 100, 10D and the semiconductor layer 12A.

Still further, while FIGS. 9A-10B are shown and described as having a discontinuous Chromium layer 14, it is understood that a contact described herein can include any combination of one or more layers in the contact stack, which are discontinuous. To this extent, in other embodiments, a contact can include any combination of one or more discontinuous layers selected from: the Chromium layer 14; the Titanium layer 16; the Aluminum layer 18; the barrier layer 20; the gold layer 22; and/or the like. In each case, the particular combination of materials (e.g., metals) of the discontinuous layer can be selected based on desired adhesive, ohmic, reflective, and/or the like, properties of the materials. Furthermore, a relative amount and/or arrangement of each material in a discontinuous layer can be selected based on a tradeoff between the properties provided by each of the materials. In each case, the size and/or shape of the openings can be uniform or irregular. To this extent, openings of a circular shape and similar size are only illustrative, and the openings can have any shape and/or combination of various sizes.

Figure 11:
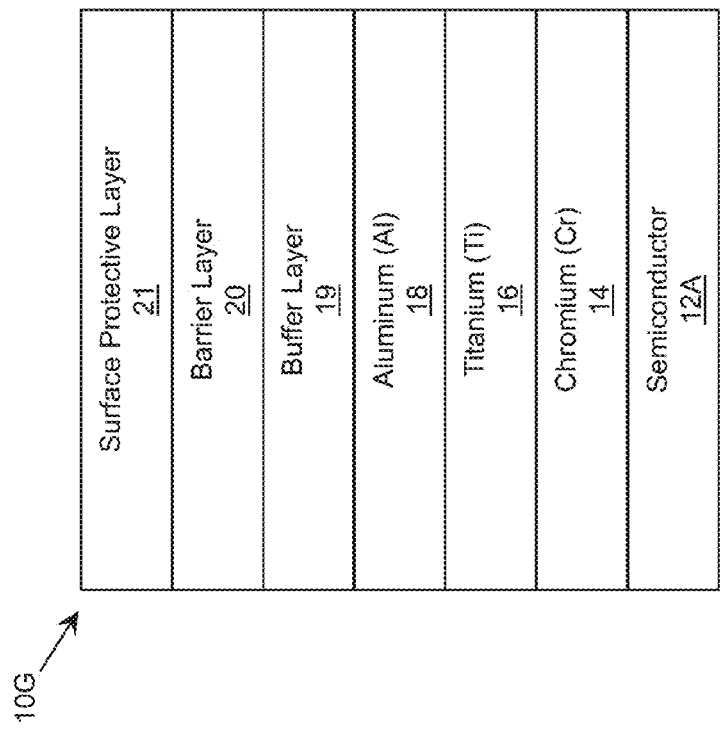
FIG. 11 shows an illustrative contact according to an embodiment.

A contact described herein can include one or more additional and/or alternative layers. To this extent, FIG. 11 shows an illustrative contact 11G according to an embodiment. In this case, the contact 11G is formed over a semiconductor layer 12A and includes a Chromium layer 14, a Titanium layer 16, and an Aluminum layer 18, each of which can be configured as described herein. Additionally, the contact 11G is shown including a buffer layer 19, which can be configured to regulate an amount of a metal present in an alloy during the annealing. In an embodiment, the buffer layer 19 is a Titanium layer, which can regulate an amount of Titanium present in the alloy. During annealing, the Titanium layer 16 can be consumed by reaction with underlying III-nitrides. The reaction results in the formation of titanium nitride and an increasing concentration of nitrogen vacancies in semiconductor material. Inclusion of the Titanium buffer layer 19 can help keep a concentration of Titanium in the Cr—Ti—Al metal alloy close to constant during the entire annealing process, which can include one or more additional annealings. The contact 11G also is shown including a barrier layer, which can be configured as described herein and a surface protective layer 21. The surface protective layer 21 can be a Gold layer (which can be configured similar to the Gold layer 22) or a layer of another metal capable of providing surface protection (e.g., from oxidation) for the contact 10G. For example, the surface protective layer 21 can be a layer of Platinum, Palladium, Rhodium, and/or the like.

Returning to FIG. 1B, in an embodiment, the metallic contact 10B includes a discontinuous Chromium layer 14, which can be configured as described in conjunction with FIGS. 9A-10B, and the interfacial layer 24 is configured to promote current spreading in discontinuous portion(s) of the Chromium layer. For example, the interfacial layer 24 can have resistive properties such that, during operation of the corresponding device, a sufficient amount of current spreading is present in the discontinuous portion(s) of the Chromium layer 14 through the interfacial layer 24. In an illustrative embodiment, the interfacial layer 24 can be configured to provide a contact resistance similar to a contact resistance of a contact having a continuous Chromium layer with no interfacial layer 24. As used herein, the two resistances are similar when one resistance is no more than approximately twenty percent higher than the other resistance.

In an embodiment, the interfacial layer 24 can be formed using an overgrowth procedure. For example, at least a portion of an exposed surface of the semiconductor layer 12A can be etched using any solution. Subsequently, the interfacial layer 24 (and/or the insulating layer 12B) can be grown over the etched portion of the semiconductor layer 12A. It is understood, that when present, the insulating layer 12B can be discontinuous to allow current to flow from the contact layer 24 into the semiconductor layer 12A. Such an insulating layer 12B can comprise, for example, a patterned layer including insulating domains forming a set of islands. Alternatively, a patterned insulating layer can comprise a layer of material with openings formed therein.

In an illustrative embodiment, an overgrowth procedure described in U.S. patent application Ser. No. 13/775,038, which is hereby incorporated by reference, is used to form the interfacial layer 24 and the ohmic contact 10B, which can be performed without etching the semiconductor layer 12A. For example, the semiconductor layer 12A can be patterned by a process including: depositing a masking material; overgrowing unmasked regions with the interfacial layer 24; and removing the masking material. The masking material can comprise any suitable material, such as $SiO_2$, $Si_3N_4$, and/or the like.

While primarily shown and described as a contact and a semiconductor device, it is understood that the invention provides a method of fabricating such a contact and/or semiconductor device. For example, as shown in FIGS. 1A-B, the semiconductor device can be fabricated by obtaining a semiconductor structure 12 having an exposed surface and a semiconductor 12A below the exposed surface and forming contact 10A or 10B to semiconductor 12A on the exposed surface. As described herein, contact 10A or 10B includes Chromium over the exposed surface, Titanium directly on the Chromium, and Aluminum directly on the Titanium. Either contact 10A-B can include one or more additional metals/layers, which can be formed using any solution. Further, the formation of contact 10A or 10B can include annealing the contact, e.g., at a temperature between approximately 500 degrees Celsius and approximately 1100 degrees Celsius. Formation of the semiconductor device can include various additional known steps/processes, which are not described herein for clarity.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A method comprising:
    forming an ohmic contact to a group III nitride layer in a semiconductor structure, the group III nitride layer having an Aluminum molar fraction of at least approximately 0.5, wherein the forming includes:
    forming a multi-layer structure comprising:
        the semiconductor structure;
        a Chromium layer over the semiconductor structure;
        a Titanium layer directly on the Chromium layer; and
        an Aluminum layer directly on the Titanium layer; and
    annealing the multi-layer structure.

2. The method of claim 1, the multi-layer structure further comprising a barrier layer directly on the Aluminum layer.

3. The method of claim 2, wherein the barrier layer is a Titanium layer.

4. The method of claim 2, the multi-layer structure further comprising a Gold layer directly on the barrier layer.

5. The method of claim 4, wherein at least one layer in the multi-layer structure is discontinuous.

6. The method of claim 5, wherein the at least one layer includes the Chromium layer.

7. The method of claim 1, the multi-layer structure further comprising:
    a buffer layer directly on the Aluminum layer;
    a barrier layer directly on the buffer layer; and
    a surface protective layer directly on the barrier layer.

8. The method of claim 7, wherein the barrier layer includes at least one of: Titanium, Chromium, Nickel, Cobalt, Platinum, Lead, Molybdenum, or Tungsten.

9. The method of claim 1, wherein the annealing is performed at a temperature between approximately 850 degrees Celsius and approximately 1100 degrees Celsius.

10. A method of fabricating a semiconductor device comprising:
    forming an ohmic contact on a semiconductor structure of the semiconductor device, wherein the forming includes:
    forming a multi-layer structure comprising:
        the semiconductor structure;
        a Chromium layer over the semiconductor structure;
        a Titanium layer directly on the Chromium layer; and
        an Aluminum layer directly on the Titanium layer; and
    annealing the multi-layer structure at a temperature between approximately 850 degrees Celsius and approximately 1100 degrees Celsius.

11. The method of claim 10, wherein at least one layer in the multi-layer structure is discontinuous.

12. The method of claim 11, wherein the at least one layer includes the Chromium layer, and wherein the method further comprises depositing a second metal, distinct from the Chromium in a set of openings of the Chromium layer.

13. The method of claim 12, wherein the second metal has at least one of: improved adhesive properties or improved reflective properties than the Chromium layer.

14. The method of claim 10, wherein the forming the multi-layer structure further includes forming a Titanium layer directly on the Aluminum layer.

15. The method of claim 10, wherein the ohmic contact is to a group III nitride layer in the semiconductor structure, and wherein the group III nitride layer has an Aluminum molar fraction of at least approximately 0.5.

16. The method of claim 10, wherein the device is one of: a light emitting diode, a laser, a field effect transistor, a solar cell, a charge coupled device, a Schottky diode, or a p-n junction diode.

17. A method of fabricating a light emitting device, the method comprising:
    forming an ohmic contact to a group III nitride layer in a semiconductor structure of the light emitting device, the group III nitride layer having an Aluminum molar fraction of at least approximately 0.5, wherein the forming includes:
    forming a multi-layer structure comprising:
        the semiconductor structure;
        a Chromium layer over the semiconductor structure;
        a Titanium layer directly on the Chromium layer; and
        an Aluminum layer directly on the Titanium layer; and
    annealing the multi-layer structure.

18. The method of claim 17, wherein the annealing is performed at a temperature between approximately 850 degrees Celsius and approximately 1100 degrees Celsius.

19. The method of claim 17, wherein at least one layer in the multi-layer structure is discontinuous.

20. The method of claim 19, wherein the at least one layer includes the Chromium layer.

* * * * *